United States Patent
Hill et al.

(10) Patent No.: US 9,852,090 B2
(45) Date of Patent: Dec. 26, 2017

(54) SERIAL MEMORY DEVICE ALERT OF AN EXTERNAL HOST TO COMPLETION OF AN INTERNALLY SELF-TIMED OPERATION

(71) Applicant: Adesto Technologies Corporation, Sunnyvale, CA (US)

(72) Inventors: Paul Hill, Eastleigh (GB); Stephen T. Trinh, San Jose, CA (US); Dian Wang, Sunnyvale, CA (US)

(73) Assignee: Adesto Technologies Corporation, Santa Clara, CA (US)

( * ) Notice: Subject to any disclaimer, the term of this patent is extended or adjusted under 35 U.S.C. 154(b) by 431 days.

(21) Appl. No.: 14/516,261

(22) Filed: Oct. 16, 2014

(65) Prior Publication Data

US 2015/0293864 A1 Oct. 15, 2015

Related U.S. Application Data

(60) Provisional application No. 61/914,451, filed on Dec. 11, 2013.

(51) Int. Cl.
| | |
|---|---|
| *G06F 13/22* | (2006.01) |
| *G06F 13/42* | (2006.01) |
| *G11C 5/06* | (2006.01) |
| *G11C 13/00* | (2006.01) |
| *G11C 16/10* | (2006.01) |
| *G11C 16/32* | (2006.01) |
| *G11C 19/28* | (2006.01) |
| *G11C 7/10* | (2006.01) |
| *G11C 7/22* | (2006.01) |

(52) U.S. Cl.
CPC ......... *G06F 13/22* (2013.01); *G06F 13/4221* (2013.01); *G11C 5/066* (2013.01); *G11C 13/0002* (2013.01); *G11C 13/0011* (2013.01); *G11C 13/0061* (2013.01); *G11C 13/0069* (2013.01); *G11C 16/10* (2013.01); *G11C 16/32* (2013.01); *G11C 19/28* (2013.01); *G11C 7/1063* (2013.01); *G11C 7/22* (2013.01); *G11C 7/227* (2013.01); *G11C 2013/0073* (2013.01)

(58) Field of Classification Search
None
See application file for complete search history.

(56) References Cited

U.S. PATENT DOCUMENTS

| | | | |
|---|---|---|---|
| 6,298,386 B1 | 10/2001 | Vahalia et al. | |
| 6,484,218 B1 | 11/2002 | Pipho | |
| 8,429,329 B2 * | 4/2013 | Pekny | G06F 12/0246 711/103 |
| 2002/0032823 A1 | 3/2002 | Scardamalia et al. | |
| 2005/0060479 A1* | 3/2005 | Deng | G06F 13/385 710/306 |

(Continued)

*Primary Examiner* — Farley Abad
*Assistant Examiner* — Dayton Lewis-Taylor
(74) *Attorney, Agent, or Firm* — Michael C. Stephens, Jr.

(57) ABSTRACT

In one embodiment, a method of performing an active polling operation can include: (i) detecting a self-timed operation that is to be executed on a serial memory device; (ii) determining if an active polling mode has been enabled; (iii) determining when the self-timed operation has completed execution on the serial memory device; and (iv) providing a completion indication external to the serial memory device when the self-timed operation has completed execution and the active polling mode is enabled.

20 Claims, 14 Drawing Sheets

(56) References Cited

U.S. PATENT DOCUMENTS

| | | | |
|---|---|---|---|
| 2009/0089492 A1* | 4/2009 | Yoon | G06F 13/1689 711/103 |
| 2009/0259789 A1 | 10/2009 | Kato et al. | |
| 2011/0179229 A1* | 7/2011 | Chen | G06F 12/0815 711/141 |
| 2013/0339638 A1 | 12/2013 | Lazmi et al. | |
| 2017/0161216 A1 | 6/2017 | Hill | |

* cited by examiner

SERIAL MEMORY DEVICE ALERT OF AN EXTERNAL HOST TO COMPLETION OF AN INTERNALLY SELF-TIMED OPERATION

RELATED APPLICATIONS

This application claims the benefit of U.S. Provisional Application No. 61/914,451, filed Dec. 11, 2013, which is incorporated herein by reference in its entirety.

FIELD OF THE INVENTION

The present invention generally relates to the field of semiconductor memory. More specifically, embodiments of the present invention pertain to serial memory devices, which may include resistive random-access memory (ReRAM), and/or conductive bridging RAM (CBRAM) processes and devices.

BACKGROUND

Non-volatile memory (NVM) is increasingly found in applications, such as solid-state hard drives, removable digital picture cards, and so on. Flash memory is the predominant NVM technology in use today. However, flash memory has limitations, such as a relatively high power, as well as relatively slow operation speed. Other NVM technologies, such as resistive switching memory technologies that include resistive RAM (ReRAM) and conductive bridging RAM (CBRAM), may offer relatively lower power and higher speeds as compared to flash memory technologies. For example, CBRAM utilizes a conductive bridging cell technology, which has the potential to scale to smaller sizes than flash memory devices.

SUMMARY

In one embodiment, a serial memory device can include: (i) a command decoder configured to detect a self-timed operation that is to be executed on the serial memory device; (ii) a mode detector configured to detect when an active polling mode is enabled; and (iii) an operation completion indicator configured to provide a completion indication external to the serial memory device when the self-timed operation has completed execution and the active polling mode is enabled.

In one embodiment, a method of performing an active polling operation can include: (i) detecting a self-timed operation that is to be executed on a serial memory device; (ii) determining if an active polling mode has been enabled; (iii) determining when the self-timed operation has completed execution on the serial memory device; and (iv) providing a completion indication external to the serial memory device when the self-timed operation has completed execution and the active polling mode is enabled.

Particular embodiments are suitable for serial memory devices (e.g., Flash memories), and may include resistive switching memories, such as resistive random-access memory (ReRAM) and/or conductive bridging RAM (CBRAM) memory cells.

DETAILED DESCRIPTION OF EMBODIMENTS

Reference will now be made in detail to particular embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, processes, components, structures, and circuits have not been described in detail so as not to unnecessarily obscure aspects of the present invention.

Some portions of the detailed descriptions which follow are presented in terms of processes, procedures, logic blocks, functional blocks, processing, schematic symbols, and/or other symbolic representations of operations on data streams, signals, or waveforms within a computer, processor, controller, device, and/or memory. These descriptions and representations are generally used by those skilled in the data processing arts to effectively convey the substance of their work to others skilled in the art. Usually, though not necessarily, quantities being manipulated take the form of electrical, magnetic, optical, or quantum signals capable of being stored, transferred, combined, compared, and otherwise manipulated in a computer or data processing system. It has proven convenient at times, principally for reasons of common usage, to refer to these signals as bits, waves, waveforms, streams, values, elements, symbols, characters, terms, numbers, or the like.

Example CBRAM Cell Structure and Architecture

Particular embodiments may be directed to resistive switching memories (e.g., conductive bridging random-access memory [CBRAM], resistive RAM [ReRAM], etc.). The invention, in its various aspects, will be explained in greater detail below with regard to exemplary embodiments. Particular embodiments can include structures and methods of operating resistive switching memories that can be programmed/written and erased between one or more resistance and/or capacitive states. Resistive switching memory devices can include a plurality of resistive memory cells with "programmable impedance elements" or any type of resistive switching or resistance-change memory cells or elements.

Figure 1:
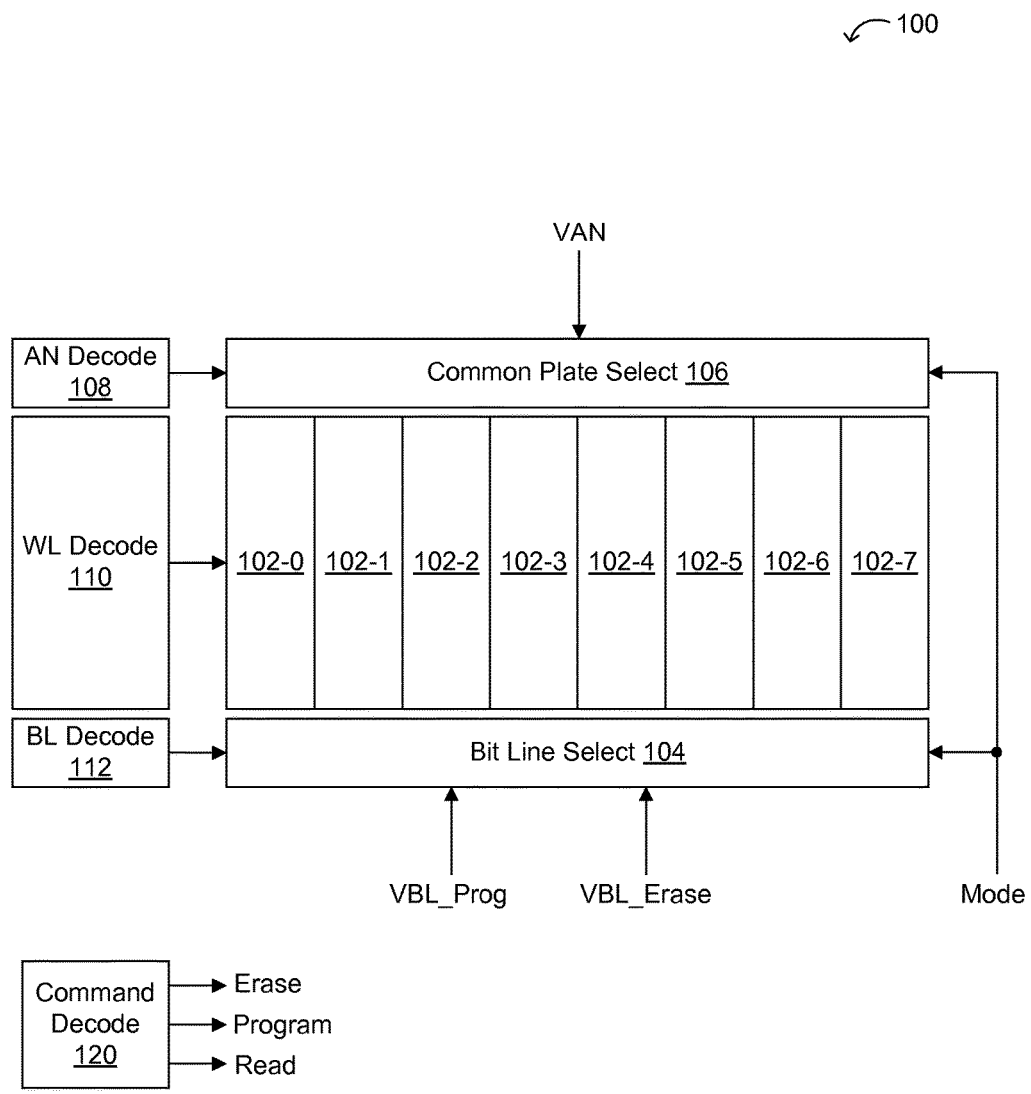
FIG. 1 is an example memory device arrangement.
Figure 2:
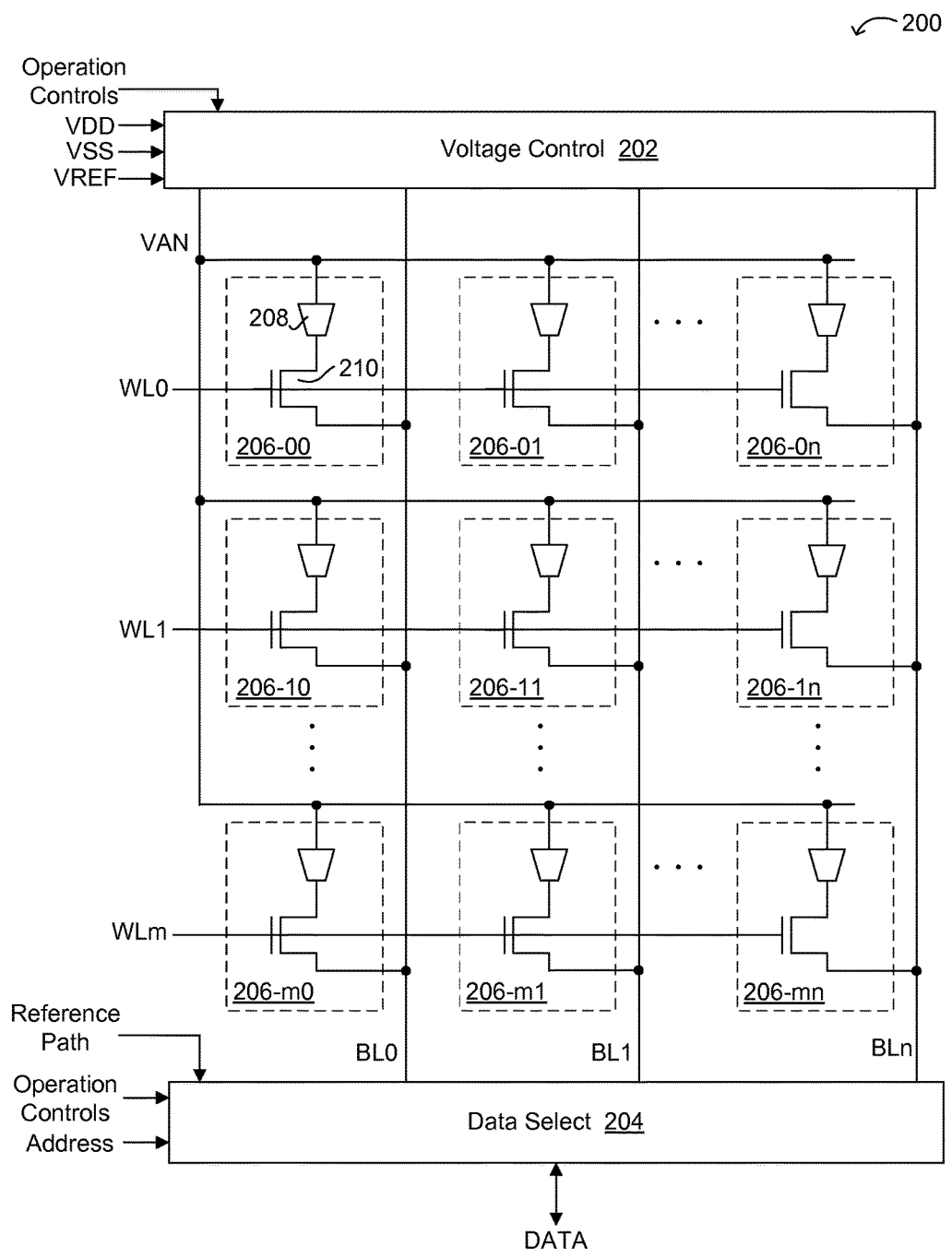
FIG. 2 is a schematic block diagram of an example common anode array structure.

FIGS. 1 and 2 show example memory architectures and circuit structures that can utilize programmable impedance elements. However, particular embodiments are amenable to a wide variety of memory architectures, circuit structures, and types of non-volatile memories, including resistive switching memories.

Referring now to FIG. 1, an example memory device is shown and designated by the general reference character 100. A memory device 100 can include common anode sectors 102-0 to 102-7, bit line selection circuitry 104, common plate selection circuitry 106, anode decoding circuitry 108, word line decoding circuitry 110, and bit line decoding circuitry 112. A memory device 100 can be a single integrated circuit, or may form a portion of a larger integrated circuit device that provides functions in addition to memory, such as in an "embedded" memory configuration.

FIG. 1 may also include command decoding circuitry 120. For example, command decoding circuitry 120 may receive external signals, or control signals derived therefrom, and may generate various internal control signals (e.g., program, erase, read, etc.) in response. Such internal operation control signals can be used to generate various supply levels (e.g., particular program and erase voltage levels), as well as other control signals (e.g., erase operation control signals), as will be discussed in more detail below. In this way, command decoding circuitry 120 may be used to determine an operation to be performed on the device.

Common anode sectors (102-0 to 102-7) can each include a number of memory cells arranged into one or more columns and multiple rows, and coupled to a common anode plate. Each memory cell can include one or more programmable impedance elements or CBRAM storage elements, and a selection device. Generally, a CBRAM storage element may be configured such that when a bias greater than a threshold voltage is applied across electrodes of the CBRAM storage element, the electrical properties of the CBRAM storage element can change. For example, in some arrangements, as a voltage is applied across the electrodes of the CBRAM storage element, conductive ions within an ion conductor may begin to migrate and form an electrodeposit at or near the more negative of the electrodes. Such an electrodeposit, however, is not required to induce a change in electrical properties. The term "electrodeposit" as used herein means any area within the ion conductor that has an increased concentration of reduced metal or other conductive material compared to the concentration of such material in the bulk ion conductor material. As the electrodeposit forms, the resistance between the electrodes can decrease, and other electrical properties may also change. If a voltage is applied in reverse, the electrodeposit can dissolve back into the ion conductor and a device can return to a former electrical state (e.g., high resistance state).

Voltages VBL_Prog, VBL_Erase, and VAN may be conventional power supply voltages, such +5 and 0 volts, or +3.3 and 0 volts, or +1.2 and 0 volts. In one example, such voltages may be one or more power supply voltages received at an external pin of an integrated circuit including memory device 100. In another example, such voltages may be one or more voltages generated by a voltage regulator of an integrated circuit that includes memory device 100. In any event, such voltages may be used, either directly or indirectly, for programming (e.g., in a forward bias configuration) or erasing (e.g., in a reverse bias configuration) a CBRAM cell by applying suitable voltages across the electrodes thereof.

Bit line selection circuitry 104 can selectively connect bit lines of one or more common anode sections (102-0 to 102-7) according to a mode of operation and bit line decoding values. In one particular example, bit line selection circuitry 104 can advantageously connect a selected bit to either of voltages VBL_Prog or VBL_Erase. That is, in a program operation, a selected bit line can be connected to voltage VBL_Prog, while in an erase operation, a selected bit line can be connected to voltage VBL_Erase.

Common plate selection circuitry 106, can connect anode plates to an inhibit voltage for CBRAM cells that are not selected (e.g., via anode decode 108) for erase or program. It is noted that an arrangement like that shown in FIG. 1 can advantageously provide program and erase voltages without having to include charge pumps or the like, to a voltage that is outside a power supply range, as may exist in other approaches. Instead, supply voltages applied across a selected CBRAM device can be switched between program and erase operations. In this way, program and erase can be "symmetric" operations. That is, in a programming operation, a CBRAM cell to be programmed can be connected between suitable voltages (e.g., V1-V2) in an anode-to-cathode direction. In an erase operation, a CBRAM cell to be erased can be connected between suitable voltages (e.g., V2-V1) in a cathode-to-anode direction.

Bit line decoding circuitry 112 can generate values for selecting given bit lines for read, program, and erase operations. In one arrangement, in response to address information (e.g., column address data), bit line decoding circuitry 112 can generate bit line select signals for application to bit line select circuitry 104. Word line decoding circuitry 110 can generate values for selecting a given set of memory cells by enabling access devices in one or more selected rows of common anode sections (102-0 to 102-7). In response to address information (e.g., row address data), one or more word lines can be driven to a select voltage to thereby enable the corresponding select device (e.g., a transistor) in a row of memory cells.

Referring now to FIG. 2, shown is a schematic block diagram of an example common anode array structure 200, which can be one implementation of the example shown in FIG. 1. In this example, voltage control 202 can receive various supply voltages (e.g., VDD, VSS, VREF, etc.), as well as operation controls (e.g., program, erase, verify, read, etc.). Resistive memory cells 206 can include a programmable impedance element 208 and an access transistor 210, as shown. In this particular arrangement, the anode of each memory cell 206 can connect together in a common anode structure. For example, the common anode can be a large plate structure that may be biased at a voltage VAN generated by voltage control 202. Of course, other voltage generation control and regulated levels, as discussed above, can be utilized in certain embodiments.

In this example, data select 204 can provide an interface between the bit lines (BL0, BL1, . . . BLn) and a data path that is coupled to a sensing or amplification block, as well as to write circuitry. Address decoding can be used to determine which of the bit lines are mapped to the data lines in a particular access cycle. Other types of addressing or decoding (e.g., anode-based decoding) can also be employed. For example, the common anode structure as shown can be broken up into a plurality of sub blocks of common anodes, and each of these may be addressed and decoded. In addition, word line (WL0, WL1, . . . WLm) decoding can be utilized for activation of the appropriate word line for a given cycle.

Further, a reference path can also be coupled to data select 204. The reference path can be used by a sensing circuit in order to compare against a regular bit line. For example, a current from a selected bit line and its selected memory cell 206 can be compared against a current from a reference bit line, where the reference bit line is biased such that appropriate data states on the selected memory cell via the selected bit line can be detected. In one application, the capacitance on the reference bit line and reference memory cell structure can match the capacitance on a regular memory cell/bit line such that these effects are negated during the sensing process.

Other architectures can also be employed with sensing circuitry, arrangements, and methods of particular embodiments. For example, a common cathode structure, whereby a plurality of memory cells are coupled together via a common cathode connection, can be supported. In such a case, the access transistor may connect the anode to the corresponding bit line in a bit line anode arrangement. Also, cathode-based decoding can be used in such an arrangement. Another example architecture or memory cell arrangement is a strapped source structure. In any event, particular embodiments are suitable to a wide variety of resistive memory cell architectures and arrangements.

Data select 204 can also receive operation control signals. These signals can be used to set a read data path, a write data path, and sensing circuitry, as appropriate for the given command. For example, a read data path may be activated for a read operation, a program verify operation, or an erase verify operation. Also, a write data path may be activated for a program or erase operation. For example, a common bidirectional sensing circuit can be employed in each of these operations. In particular, the bidirectional sensing circuit can allow for a program verify to be performed using a same forward bias (anode voltage higher with respect to cathode voltage) on the memory cell as was used to program the memory cell. Similarly, the bidirectional sensing circuit can allow for an erase verify to be performed using a same reverse bias (cathode voltage higher with respect to anode voltage) on the memory cell as was used to erase the memory cell.

Sensing circuits in particular embodiments also aim to minimize disturbance of the accessed cell resistance during the read operation to determine a data state from that cell. Thus, a cell that is programmed (e.g., in a data state "0") should remain in that state after a program verify or standard read operation, and a cell that is erased (e.g., in a data state "1") should remain in that state after an erase verify or standard read operation. The CBRAM cell may generally be programmed with a forward bias voltage (positive with respect to anode and cathode), and may be erased with a reverse bias voltage (negative with respect to anode and cathode). Various voltages for bit lines and the common anode plate can be supported in particular embodiments. Voltages can also be changed depending on the bias direction (forward or reverse) for a read operation.

Having described the various sections of FIG. 2, one example of the operation of such a memory device will now be described with reference to an operation that accesses memory cell 206-00. Initially, word lines WL0, WL1, . . . WLm can be driven to a de-select voltage (e.g., low) by associated word line drivers. Bit line selection circuitry 104 can place bit lines BL0 and BL1 in the de-selected state. Similarly, common plate selection circuitry 106 can place common anode plates in the de-select state.

A write operation can include program and erase operations. In a program operation, in response to address and mode data, bit line selection signals can be used to connect a selected bit line to read/write control circuitry via data select 204. In contrast, other bit lines can be de-selected, and thus placed in the de-selected state. Mode selection values can result in read/write control circuitry connecting the selected bit line (e.g., BL0) to a cathode program voltage. A program operation can also include anode plate voltage VAN being connected to a program voltage, while connecting the selected bit line is grounded. A word line driver corresponding to the selected memory cell can be driven to a select voltage, thereby placing the selected memory cell between suitable programming voltages.

An erase operation can occur in the same general fashion, but with the erase voltage being applied to the selected bit line and common anode voltage VAN. As noted in the example of FIG. 1, in particular embodiments, such an operation can be symmetrical. Also, while FIG. 2 shows n-channel MOS transistors 210 as access devices, other embodiments may include different types of access devices. In such alternate embodiments, associated word line drivers would provide appropriate voltage and/or currents to enable such access devices. In this way, bit line selection, anode plate selection, and word line activation can be utilized to program and/or erase a CBRAM array having bit lines connected to cathodes of CBRAMs within multiple memory cells.

While particular example architectures and circuits suitable for CBRAMs, and memory arrays formed thereof, are shown with respect to FIGS. 1 and 2, programmable impedance elements in certain embodiments are suitable to a wide variety of architectures and/or circuit arrangements.

Figure 3:
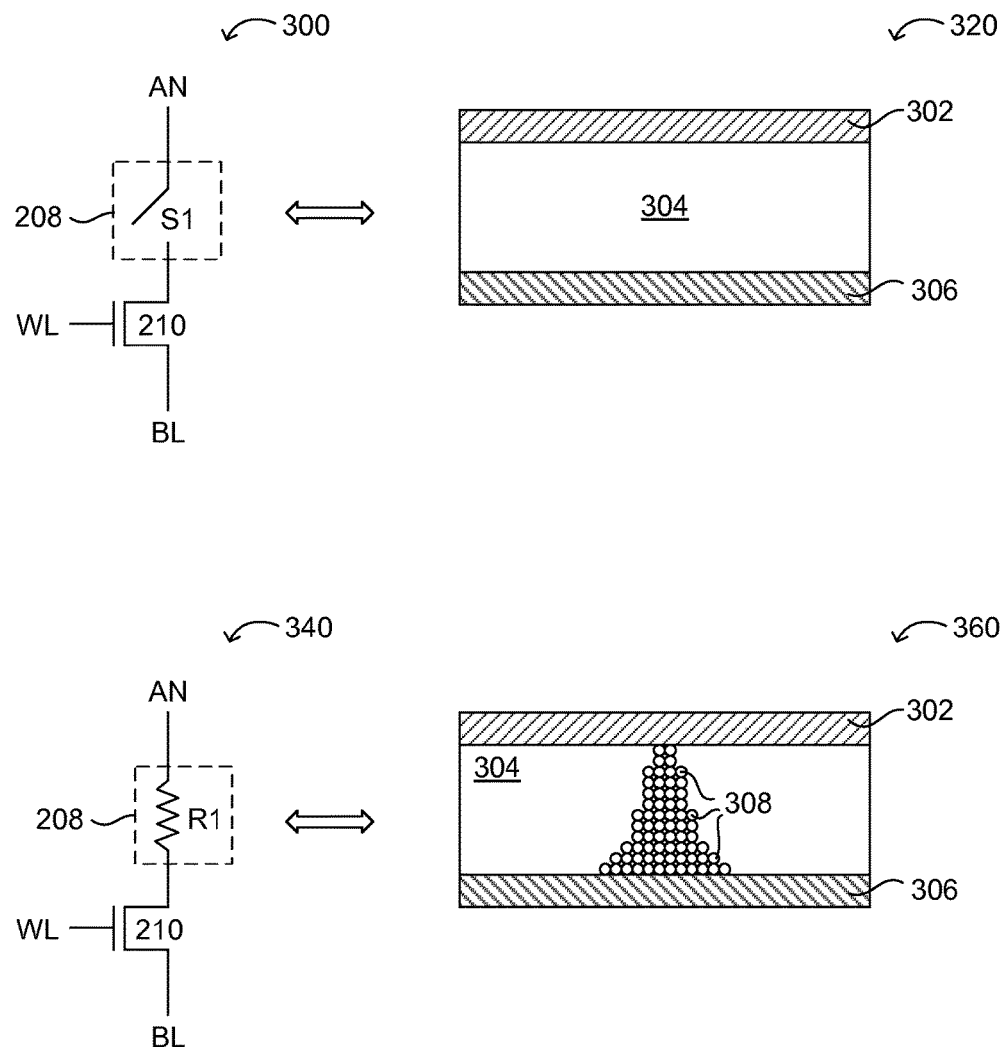
FIG. 3 is a diagram of an example programmable impedance element with schematic modeling.

Referring now to FIG. 3, shown is a diagram of an example programmable impedance element with schematic modeling. For example, example 300 shows a memory cell with an open switch S1 representation of programmable impedance element 208. The programmable impedance element or CBRAM storage element portion of this representation corresponds to the cross-section diagram 320, which represents a resistive storage element in a high impedance state (e.g., data state "1"), or an erased state. Particular embodiments can also include any type of resistive switching or resistance-change memory cells or elements. In one example, CBRAM storage element 320 can include electrochemically active electrode 302, solid electrolyte 304, and inert electrode 306. The example CBRAM storage element 320 may represent a strong or substantially erased state of the cell. As shown, substantially no conductive path between active electrode 302 and inert electrode 306 is seen in CBRAM storage element 320.

Schematic representation 340 and corresponding cross-section diagram 360 show examples of CBRAM storage element 208 in a low impedance state (e.g., data state "0"), or a programmed state. For example, example 340 shows a memory cell with a resistor R1 or closed switch representation of CBRAM storage element 208. The CBRAM storage element portion of this representation corresponds to the cross-section diagram 360. In the example 360, electrodeposits 308 can form in solid electrolyte 304 to form a "bridge" or conductive path between electrochemically active electrode 302 and inert electrode 306 to program the memory cell. For example, electrodeposits 308 can be from active electrode 302, and may include silver, copper, titanium, or tellurium, as just a few examples. As shown in example CBRAM storage element 360, a full conductive path may be formed between active electrode 302 and inert electrode 306 by electrodeposits 308.

As shown in examples 300 and 340, a control transistor (e.g., 210) can also be included in each memory cell including the programmable impedance element or CBRAM storage element 208. For example, transistor 210 can be controlled by a word line, as discussed above with respect to FIG. 2. Transistor 210 may be an access transistor to allow CBRAM storage element 208 to be programmed, read, and erased.

Cell data can be erased in similar fashion to cell programming, but with a positive bias on the inert electrode. The metal ions will then migrate away from the filament, back into the electrolyte, and eventually to the negatively-charged active electrode (e.g., 302). This action dissolves the electrodeposits 308 in solid electrolyte 304, and increases the resistance again (e.g., as shown in schematic representation 300). In this way, an erase operation of a CBRAM storage element may be substantially symmetric to a program operation.

Example Serial Memory Device External Host Alert

Particular embodiments are suitable for any type of non-volatile memory device, such as those including serial interfaces with a host controller. In particular embodiments, a host controller (e.g., a general-purpose processor, a CPU, an MCU, etc.) energy footprint can be reduced by reducing CPU/MCU code execution overhead that is associated with continually polling a memory device (e.g., a serial memory device). This type of polling by the host is done to determine the end or completion of execution of an internally self-timed operation on the memory device. For example, the internal self-timed operation can be a write operation (e.g., a program operation or an erase operation) that is executed on the serial memory device.

Various polling operations may require the host to send an operation code or "opcode" (e.g., an 8-bit opcode) to the memory device. A status register (e.g., 8-bit) value can then be read out from the device, and a "ready/busyb" status bit can be interrogated in order to determine the state of the device. Each polling operation may require the host to continuously clock the memory device in order to re-read the ready/busyb status bit. The ready/busyb status bit can be used to determine whether or not an internal operation (e.g., a program or erase operation) is still in progress, or if the operation has completed. To poll the ready/busyb status bit to detect the completion of an internally timed operation, new status register data may be continually clocked out of the device until the state of the ready/busyb status bit changes from, e.g., a logic 0 to a logic 1 to indicate completion of the particular operation. Thus, a logic 0 on the ready/busyb status bit can indicate that the device remains busy with an internal operation, and a logic 1 on the ready/status bit can indicate that the device is ready for a new operation. In this way, a determination can be made as to whether the particular self-timed operation (e.g., program, erase, etc.) has completed.

In one embodiment, a serial memory device can include: (i) a command decoder configured to detect a self-timed operation that is to be executed on the serial memory device; (ii) a mode detector configured to detect when an active polling mode is enabled; and (iii) an operation completion indicator configured to provide a completion indication external to the serial memory device when the self-timed operation has completed execution and the active polling mode is enabled.

In particular embodiments, an additional command opcode can be utilized to deliver the ready busy status bit directly to a given pin (e.g., the SO pin) such that the host does not need to continuously clock the memory device. In addition, the memory device can actively change the state of the given pin (e.g., the serial output [SO] pin) once the internally self-timed operation has completed. The SO or serial output pin can be used to shift data out from the memory device. For example, data on the SO pin can be clocked out on the falling edges of the serial clock. The SO pin can be in a high-impedance state whenever the memory device is deselected (e.g., when chip select [CS] is de-asserted). In this way, an interrupt can be driven on the SO pin to alert the host as to the end or completion of the particular operation or internal cycle on the memory device.

Any suitable opcode can be employed in order to indicate to the memory device that active polling is enabled to be performed on the ready/busyb status bit. If active polling is not enabled, the serial memory device can function as normal, such as without driving the SO pin in order to indicate that an internal operation has completed execution. For example, a predetermined opcode of 0x25h can be used to indicate active polling of the ready/busyb status bit is enabled for a particular command. Opcodes can be supplied along with chip select control toggling in order to issue a command to the memory device.

In certain embodiments, any suitable serial interface between a host and a memory device can be employed. For example, a serial peripheral interface (SPI) can be utilized. SPI is a full duplex mode synchronous serial data link standard where devices communicate in master/slave mode, and the master device (e.g., the host) initiates the data frame. Multiple slave devices are allowed with individual slave selects lines. In traditional systems that utilize SPI serial flash memories, the CPU/MCU or host may need to poll the memory device repeatedly in order to determine if the internally self-timed operation (e.g., program or erase operation) has completed. The host can then proceed with the next step, such as a subsequent program or erase cycle. This continual polling may undesirably use up CPU/MCU resources and time, resulting in increased energy consumption and reduced battery life due to CPU execution of such a polling routine. In some battery powered applications, as well as in other cases, the CPU/MCU may have fewer resources to assign to other more important or system critical tasks as a result of the processor being occupied by performing such polling operations. This can lead to slower overall system performance, as well as possible resource limitations.

In one example approach, the CPU, MCU, and/or host system can implement a timer loop to allow for a predefined delay to timeout before processing the next cycle. The predetermined delay can be set to be equal to or greater than the maximum internally self-timed cycle of the serial memory device. However, while the CPU is performing a timeout or countdown of the delay, the CPU is also burning energy and resulting in CPU overhead. More advanced systems may be able to make use of an internal programmable timer, but this timer may then be dedicated to this task when it could be utilized for other more important system functions. In addition, these delays that are of fixed length based on the maximum cycle time can result in substantial wasted time if the self-timed operation is a mere fraction of this maximum allowed time. Thus, this approach can result in increased inefficiency of the system.

In systems using parallel memory device interfaces as an alternative to a serial or SPI type of interface, data polling or toggle bit polling techniques can be employed. In data polling, each time the status register is read, the output value of a given data bit can show as the complement of the original value that was written. When the bit reverts to its true value, the internal program, erase, or other self-timed operation, can be indicated as completed. In toggle bit polling, a parallel memory device data bus can toggle between 1 and 0, or between 0 and 1, each time the status register is read and while the device is still performing an internally self-timed write cycle. When the internal self-timed cycle has completed, the host can read two consecutive true values (e.g., no toggling between 1 and 0, or between 0 and 1) as the toggle bit stops. This can indicate that the device has completed execution of its internal self-timed operation. However, in either case, the host may be required to read the status register of the memory device, thus possibly requiring processor or host intervention.

In particular embodiments, there may be no need for any CPU or host intervention with the memory device in order to determine completion of execution of the self-timed operation within the memory device, once an active polling mode has been enabled. In contrast, the memory device itself can actively notify the host or CPU of the execution end of the internal self-timed operation or cycle. In this way, CPU overhead can be reduced, energy efficiency may be increased, and software control or operation of the serial memory device can be simplified.

Figure 4:
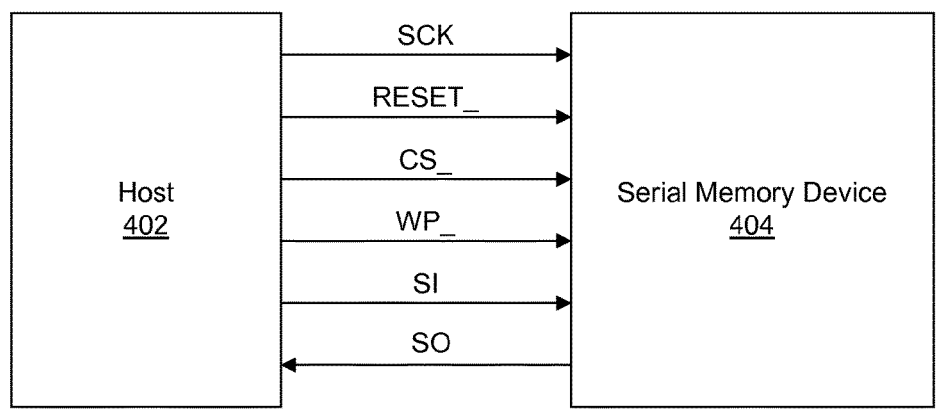
FIG. 4 is a schematic block diagram of an example host and serial memory device arrangement, in accordance with embodiments of the present invention.

Referring now to FIG. 4, shown is a schematic block diagram 400 of an example host and serial memory device arrangement, in accordance with embodiments of the present invention. In this example, host 402 can interface with serial memory device 404 via a serial interface. For example, host 402 can be any suitable controller (e.g., CPU, MCU, general-purpose processor, etc.), and serial memory device 404 can be any type of memory device (e.g., SRAM, DRAM, EEPROM, Flash, CBRAM, magnetic RAM, ReRAM, etc.). Serial memory device 404 can thus be implemented in a variety of memory technologies, such as non-volatile types. In some cases, serial memory device 404 can be a serial flash memory that may be implemented in more traditional non-volatile memories, or in CBRAM/ReRAM resistive switching memories.

Various interface signals, such as in an SPI interface, can be included for communication between host 402 and serial memory device 404. For example, serial clock (SCK) can provide a clock to device 404, and may be used to control the flow of data to and from the device. Command, address, and input data (e.g., on the SI pin) can be latched on a rising edge of SCK, while output data (e.g., on the SO pin) can be clocked out on a falling edge of SCK. The reset pin (RESET_) can be used to terminate an operation in progress, and to reset an internal state machine of serial memory device 404 (e.g., to an idle state). Serial memory device 404 can remain in the reset condition as long as a low level is present on the reset pin. Also, because serial memory device 404 can include power-on reset circuitry, there may be no restrictions on the reset pin during power-on sequences. In some other implementations, memory device 404 may not include a reset pin (RESET_), and may instead include a hold pin (HOLD_).

Chip select (CS_) can be utilized to select serial memory device 404, such as from among a plurality of such memory devices, or otherwise as a way to access the device. When the chip select signal is de-asserted (e.g., at a high level), serial memory device 404 will also be deselected, and may be placed in a standby mode. Activating the chip select signal (e.g., via a high to low transition on CS_) may be utilized to start an operation, and returning the chip select signal to a high state can be utilized for terminating an operation. For internally self-timed operations (e.g., a program or erase cycle), serial memory device 404 may not enter standby mode until completion of the particular ongoing operation if chip select is de-asserted during the operation.

Write protect (WP_) can be utilized for protection of sectors specified for protection by a register (e.g., the sector protection register). For example, such sectors may be protected against program and erase operations. Thus, if a program or erase command is issued to serial memory device 404 while the write protect pin is asserted, the device may ignore the command and perform no operation.

In the example SPI interface, data can be provided to serial memory device 404 via a serial input (SI) signal. The serial input can be utilized for data input including command and address sequences. For example, data on the serial input pin can be latched on a rising edge of SCK, and data on the serial input pin can be ignored if the device is deselected (e.g., when the chip select signal is de-asserted). Data can be output from serial memory device 404 via a serial output (SO) signal. For example, data on the serial output can be clocked out on a falling edge of SCK, and the serial output signal can be in a high impedance state when the device is deselected (e.g., when the chip select signal is de-asserted).

Figure 5:
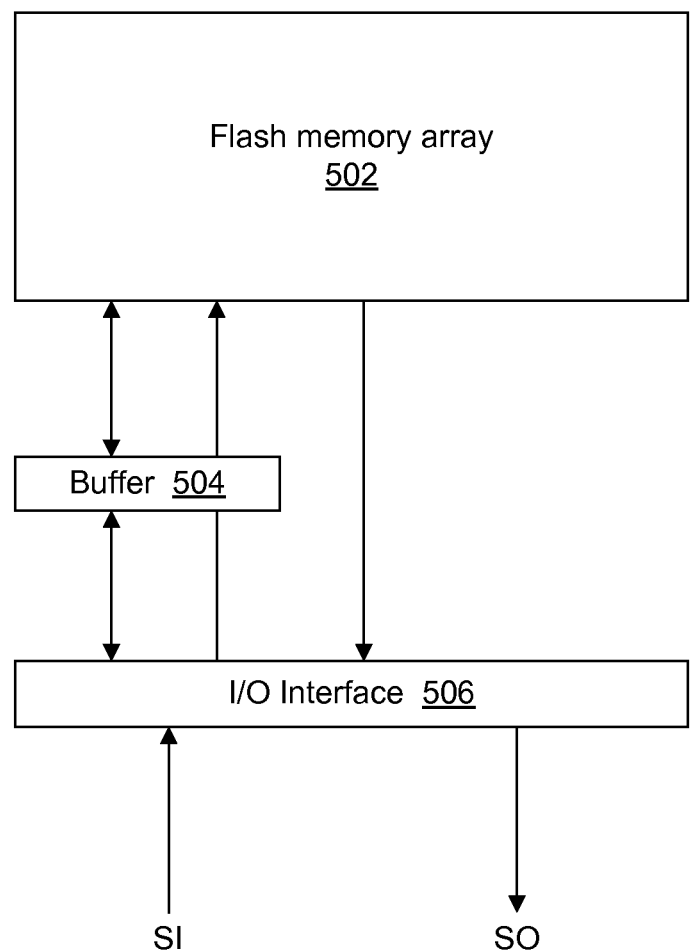
FIG. 5 is a schematic block diagram of an example serial memory device structure, in accordance with embodiments of the present invention.

Referring now to FIG. 5, shown is a schematic block diagram of an example serial memory device 404 structure, in accordance with embodiments of the present invention. For example, serial memory device 404 can include flash memory array 502, buffer 504, and I/O interface 506. In some arrangements, more than one buffer 504 can be provided, such as a buffer for an input path, and another buffer for an output path. Alternatively, or in addition, multiple buffers can be provided for multi-layer buffering. Serial memory device 404 can be configured as a data flash and/or a serial flash device. Flash memory array 502 can be organized as any suitable number of pages of data. For example, the each page can include 256 or 264 bytes of data. Similarly, buffer 504 can store a page of data. Also, I/O interface 506 can provide interfacing between flash memory array 502, buffer 504, and serial data input (SI) and output (SO). For example, I/O interface 506 may be part of an SPI or other serial type of interface.

In one embodiment, a method of performing an active polling operation can include: (i) detecting a self-timed operation that is to be executed on a serial memory device; (ii) determining if an active polling mode has been enabled; (iii) determining when the self-timed operation has completed execution on the serial memory device; and (iv) providing a completion indication external to the serial memory device when the self-timed operation has completed execution and the active polling mode is enabled.

Figure 6:
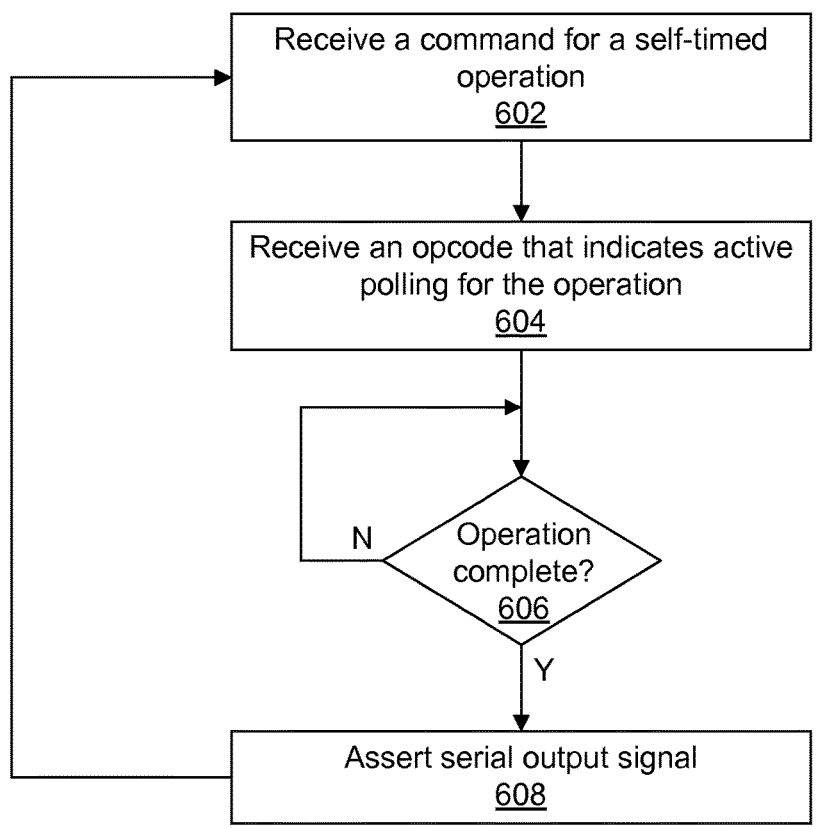
FIG. 6 is a flow diagram of an example method of alerting as to completion of a self-timed internal operation, in accordance with embodiments of the present invention.

Referring now to FIG. 6, shown is a flow diagram 600 of an example method of alerting as to completion of a self-timed internal operation, in accordance with embodiments of the present invention. At 602, a command for a self-timed operation can be received (e.g., via command decoder 120). For example, the command can be provided via the serial input signal, and may be a program or an erase operation to be performed on one or more storage cells in flash memory array 502. At 604, an opcode that indicates or enables active polling for the self-timed operation can be received (e.g., at a mode detector). For example, the opcode can be provided as a bit string (e.g., one bit at a time) via the serial input signal and may be clocked in via SCK. For example, the SO pin can enter a low impedance state (e.g., either be driven high or low) in response to active polling mode being enabled.

In some cases, the order of 602 and 604 can be reversed. For example, the opcode that enables active polling in 604 can be supplied before a command for a self-timed operation is supplied. In one example, the active polling mode can be applied to a next self-timed operation command that is received. In another example, the active polling mode can remain enabled for any subsequent self-timed operations. In this case, the active polling mode can be reset or exited by application of a different opcode to terminate the active polling mode, or by otherwise resetting the serial memory device.

In particular embodiments, once the active polling operation has been enabled (e.g., via receiving a particular opcode), the serial memory device can provide an indication when the self-timed operation has completed execution, and without other commands or periodic polling or the like from host 402. Once the operation is complete at 606, the serial output signal can be asserted at 608. For example, once a program or erase operation has completed execution, the serial output signal can change from a high impedance state to a logic level (e.g., 1 or 0), or from one low impedance state (e.g., a low level) to another low impedance state (e.g., a high level) to indicate that the operation is complete. In addition, one or more registers (e.g., a status register) can also have a ready/busyb status bit written along with activation of the serial output signal, in order to indicate completion of the self-timed operation.

Figure 7:
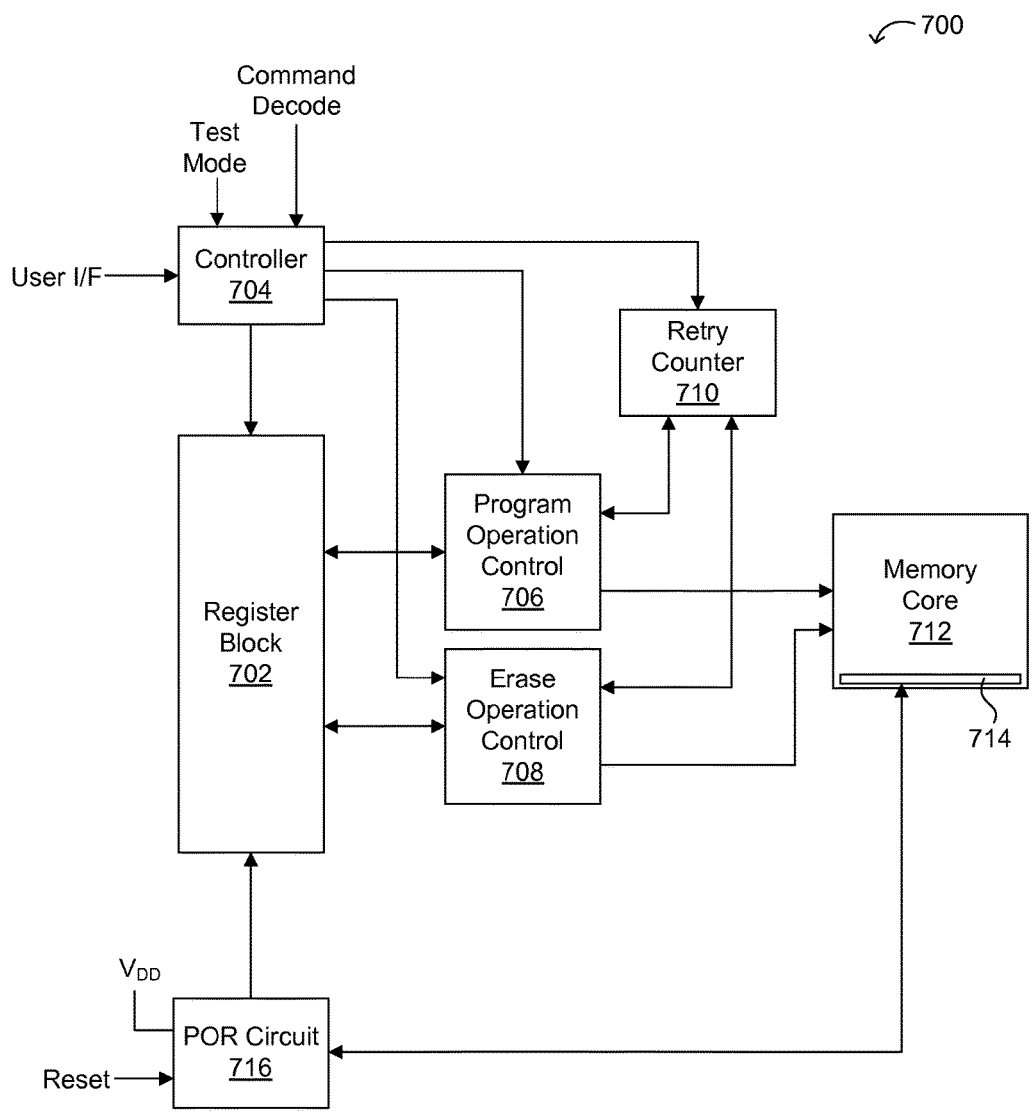
FIG. 7 is a schematic block diagram of an example register and self-timed internal operation control, in accordance with embodiments of the present invention.

Referring now to FIG. 7, shown is a schematic block diagram 700 of an example register and self-timed internal operation control, in accordance with embodiments of the present invention. For example, register block 702 can be implemented using SRAM. Register block 702 can provide algorithm and option variable selections to program operation control 706 and erase operation control 708. For example, register block 702 can also include the status register with a ready/busyb bit to indicate if the memory device is busy with an operation, or if the operation has completed. Controller 704 may determine and decode the received command, and can also control access to the register bits in register block 702. In addition, test modes (e.g., to determine operation distribution, etc.) can be used to override data in register block 702. Settings for register block 702 may be based on various default algorithm and option variable or condition settings, but can also be programmed on lot-by-lot or device-by-device basis. Also, values for program operations, erase operations, and option variable or related condition settings, can be independently programmed in register block 702.

Power-on reset (POR) circuitry or state machine 716, which can receive a reset signal (e.g., via the RESET_ pin), can access designated register data portion 714 and read out data from that dedicated section of memory array 712. Designated register data portion 714 may alternatively be located outside of memory core 712. In any event, this accessed data that is associated with memory core 712 may then be loaded into register block 702. In this way, information specific to this device can be programmed into the memory core, and whenever the device is powered on (e.g., as detected by $V_{DD}$ supply) or otherwise reset, this data can be loaded into register 702. This is because the memory core, including designated register data portion 714 may include non-volatile memory. Also, different applications-based information can be stored in non-volatile memory designated register data portion 714. Further, different parts or memory cores 712 can be independently programmed (e.g., for different applications, etc.). In some cases, this dedicated portion of memory may not be accessible to the user. However, some applications may allow access to these designated locations, such as in a test mode.

In one or more test modes, controller 704 can override one or more values stored in register 702. When the test mode is complete, data in register block 702 can revert to the data that was previously stored in the register. For example, registers 702 may be implemented as two storage bits per register cell, one such bit representing an override value that is only enabled during predetermined modes (e.g., test mode, etc.), and another bit storing the data programmed outside of the test mode (e.g., during normal operation, power up, etc.). As another example, registers 702 may be implemented as a single bit per cell or stored data bit, and data can be reverted to its previous state by accessing designated register data portion 714 and asserting the reset signal upon completion of the test mode.

In addition, registers 702 may be programmable by controller 704 and/or by a user via a separate or combined user interface. In this way, a user may be able to program data into registers 702 in order to override or change previous values therein. Particular embodiments may also support independently controlled program/erase algorithm selection for different memory cores 712. For example, controller 404 can set the register values in 702 different for different memory cores 712. For example, register block 702 may include dedicated sectors (e.g., a widened register or increased register bit length) for each memory core, or register block 702 may be replicated for each memory core 712. This may be utilized whereby one memory array 712 is dedicated to one application (e.g., code), while another memory array 712 may be dedicated to another application (e.g., data). In this way, register block 702 may accommodate independently programmable operation algorithms in support of different operations for different memory cores 712. Further, the dedicated sectors in this case can each have their own status register with a corresponding ready/busyb bit to indicate if that sector of the memory device is busy with an operation.

Various program/erase operation algorithms, as well as status, information can be stored in register block 702. For example, at least two bits can be used to indicate which of a predefined group of program algorithms is to be used to execute a program command. Similarly, at least two bits in register block 702 can be used to indicate which of a predefined group of erase algorithms is to be used to execute an erase command. Further, option variables that define conditions (e.g., pulse widths, voltage levels, current levels, etc.) for the program and erase operations of the selected operation algorithm may also be defined in register block 702. In addition, a maximum number of retry attempts, which may be embedded within one or more of the program/erase algorithms may also be stored in register block 702. For example, retry counter 710 may keep track of a number of attempts for a given program or erase operation, or a sequence of program and/or erase operations, as part of a selected program/erase operation algorithm.

Particular embodiments may also support dynamically changing the operation algorithm as the semiconductor device ages, or arrays thereof are cycled more and more. For example, counters may be used to move to different algorithm and/or option variable selections and effectively change the program/erase algorithms to be used based on the counter results. In one example, designated register data portion 714 can be updated to reflect changed algorithm selections, option variables, etc., values based on such counter results. As a result, register block 702 can be updated via POR circuit 716, as discussed above. In another example, incremented values based on the counter results can be dynamically determined based on data output from register block 702. In this case, data that is read from register block 702 can then be updated by subsequent circuitry based on the counter results, before being provided as outputs to program operation control 706 and erase operation control 708. In any event, program operation control 706 and erase operation control 708 can be used to indicate when a corresponding self-timed operation has completed execution, such as by determining that the desired state has been written into one or more selected memory cells.

Figure 8:
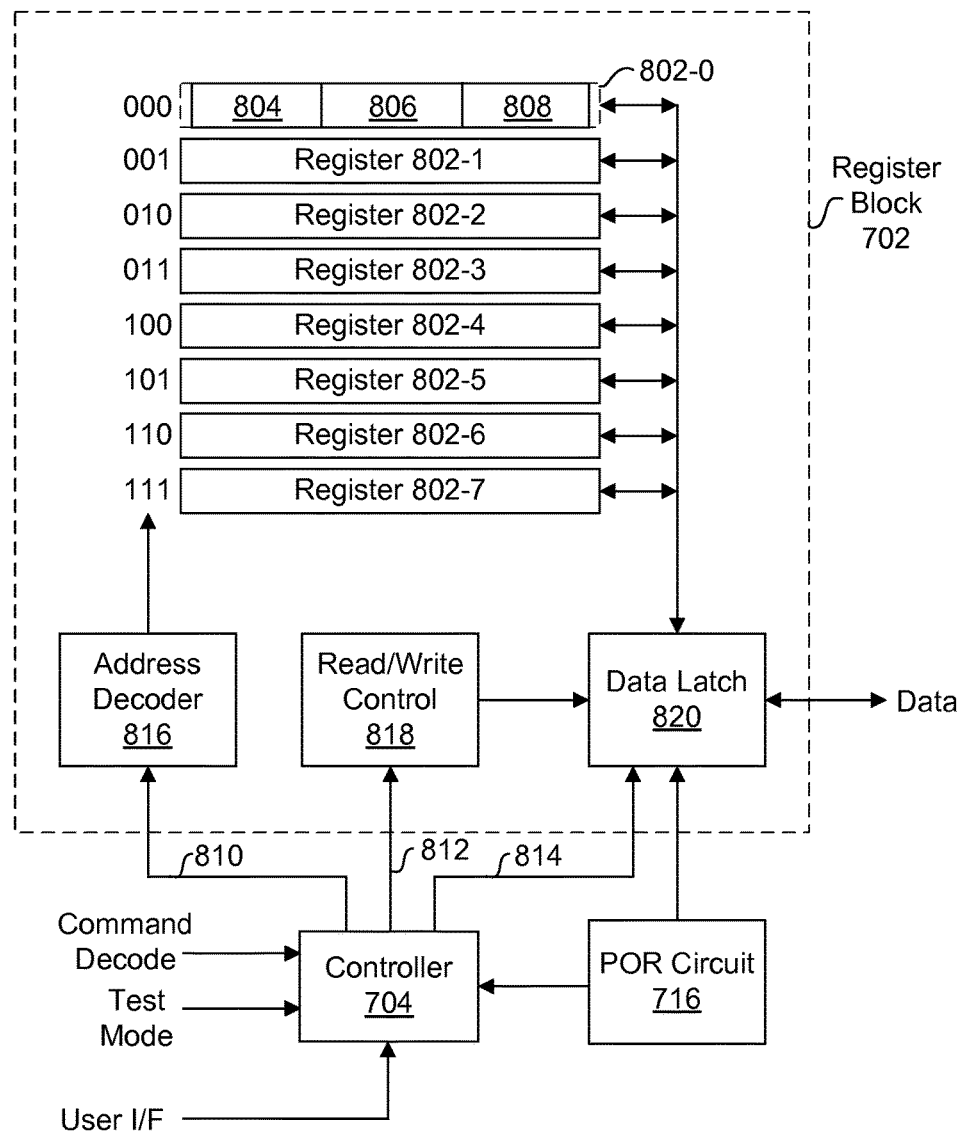
FIG. 8 is a schematic block diagram of an example register structure related to self-timed internal operations, in accordance with embodiments of the present invention.

Referring now to FIG. 8, shown is a schematic block diagram 800 of an example register structure related to self-timed internal operations, in accordance with embodiments of the present invention. In this example, register block 702 can include eight registers 802 (e.g., 802-0, 802-1, . . . 802-7). Each register 802 can include a number of fields. For example, field 804 may be a 2-bit wide field to store data representing erase operation algorithms. Also for example, field 806 may be a 2-bit wide field to store data representing program operation algorithms. Also for example, field 808 may be a 2-bit wide field to store data representing retry loops. Other fields (not shown) may be used to indicate option variables to set conditions for the various algorithms. Various fields of registers 502 may generally be used to form or support a conditions table that may be accessed (e.g., by program operation control 706, erase operation control 708, etc.) to set the conditions for one or more of the program and erase operations of a selected operation algorithm. Also, one or more of registers 802 can be configured as a status register including a ready/busyb bit to indicate if the memory device is busy with an operation, or if the operation has completed execution on the serial memory device.

Register block 702 can also include address decoder 816, which can receive signals 810 (e.g., address, address load, etc.) from controller 704, and may provide 3-bit decoded values to address one of eight registers 802. Read/write control 818 can receive signals 812 (e.g., read control signal, write control signal, etc.) from controller 704, and may provide a control signal to data latch 820. Data latch 820 can receive signals 814 (e.g., read data strobe, data out enable, load data, etc.) from controller 704, and may receive or provide the data to/from register block 702. Also, while only eight registers are shown in the particular example of FIG. 8, any suitable number of registers can be accommodated in particular embodiments. For example, 24 registers can be included, where each register is 8-bits wide. In addition, such registers may support other programmable impedance device-based functions, such as word line voltage level, compliance current (e.g., where the cell is programmed until reaching this compliance current, X µA), equalization pulse width, single ended or differential sense amplifier configuration, other status information, as well as any number of other device functions and/or parameters.

Figure 9:
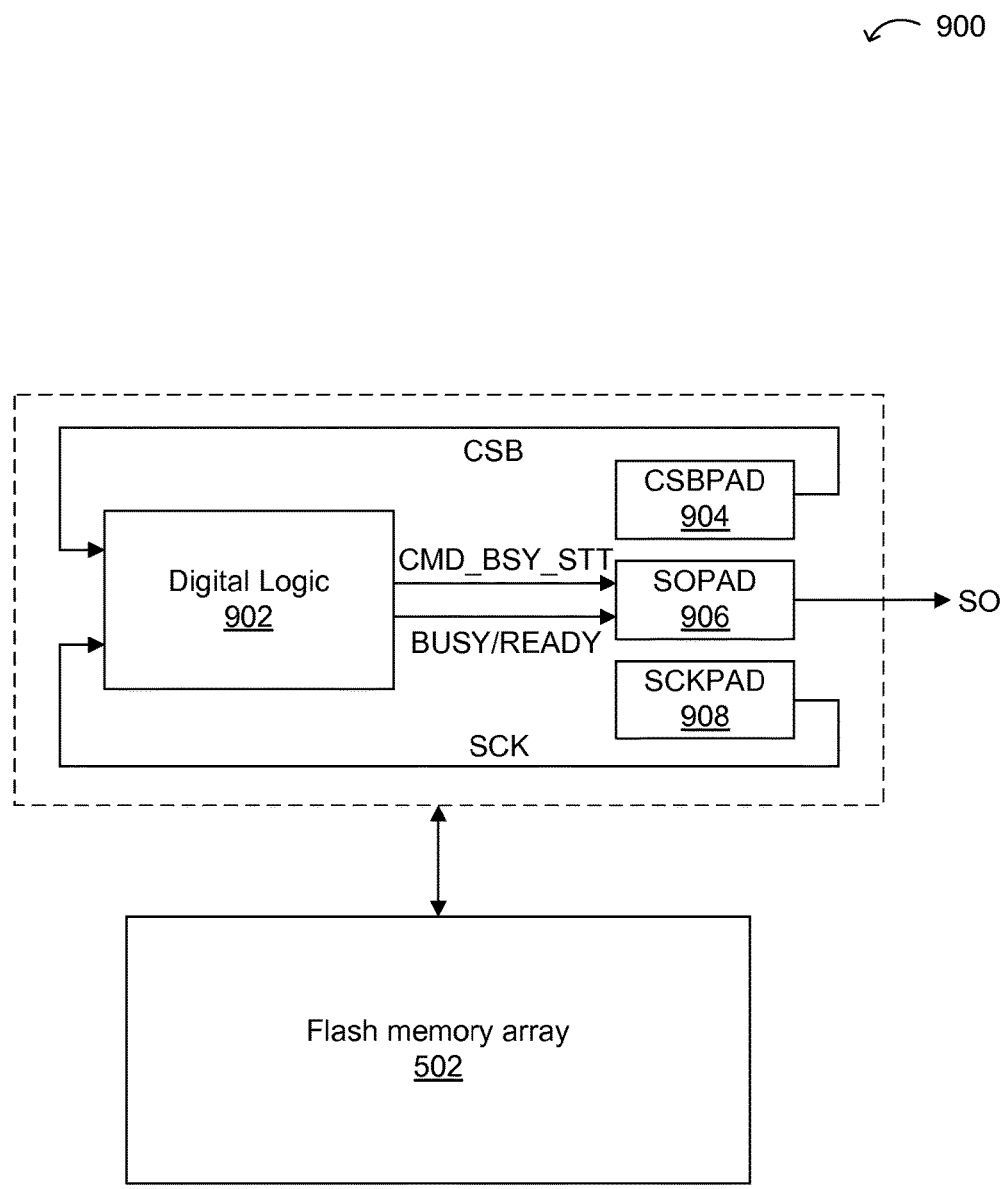
FIG. 9 is a schematic block diagram of example control for alerting as to completion of self-timed internal operations, in accordance with embodiments of the present invention.

Referring now to FIG. 9, shown is a schematic block diagram 900 of example control for alerting as to completion of self-timed internal operations, in accordance with embodiments of the present invention. In this example structure, flash memory array 502 can interface with digital logic 902, CSBPAD 904 (e.g., receiving circuit and pad for chip select CS_pin), SOPAD 906 (e.g., driving circuit and pad for serial output SO pin), and SCKPAD (e.g., receiving circuit and pad for serial clock SCK pin) 908. For example, digital logic 902 can include control circuitry for determining when a self-timed internal operation (e.g., program, erase, etc.) has completed, once the active polling mode has been enabled (e.g., via a particular opcode). CSBPAD 904 can include circuitry related to the chip select signal, and the chip select signal can be detected as asserted or de-asserted by digital logic 902. For example, the active polling mode can be enabled when the opcode is received and the serial memory device is selected by the chip select signal being asserted.

SOPAD 906 can include circuitry related to the serial output signal, and the serial output signal can be controlled by signals from digital logic 902. For example, digital logic 902 (e.g., including command decoder 120, controller 704, program erase operation control 706/708, etc.) can determine whether a self-timed internal operation has completed, and may assert the serial output signal to indicate that the operation has completed when the active polling mode has been enabled. SCKPAD 908 can include circuitry related to the serial clock, and the serial clock signal can be provided to digital logic 902 in order to control clocking in of the opcode to enable active polling, as well as to control the timing of the serial output signal at pin SO.

For example, the serial output signal can be asserted on a falling clock edge of SCK after determining that the given self-timed internal operation has completed. In another example, the serial output signal can be asserted in an asynchronous fashion once the internal operation has completed. Particular embodiments can also include an internal oscillator for use along with self-timed internal operations. In this case, an internal clock from this oscillator can be utilized to provide timing for driving the serial output signal/pin.

In certain embodiments, a separate command can be utilized to enable the active polling mode. For example, a predetermined opcode (e.g., opcode 0x25h) can be employed to indicate activation of this command. In order to clock in this predetermined opcode (25h), 8 or 16 SCK cycles may be utilized. For example, the first 8 SCK clocks can be used to enter opcode 25h, and one or more additional SCK cycles can be utilized to enable SO (e.g., to drive the serial output signal). In this case, 9 SCK cycles may be utilized, and because the SPI protocol may operate in groups of 8 SCK cycles, a dummy byte can also be added.

In particular embodiments, the status register (e.g., in register block 702) can be updated when the internal self-timed operation is complete. In addition, when the active polling mode is enabled (e.g., via opcode 25h), the completion status of an executed command may also be synchronously or asynchronously passed to the SO pin. Thus, the special command/opcode (e.g., 0x25h) can be utilized to set the internal logic (e.g., digital logic 902) to send appropriate "READY/BUSYB" status bit to the SO pin directly when the cycle or execution completes, and to trigger an SO pin change (e.g., from high to low, from low to high, from high impedance to low impedance, etc.).

In addition, a READY/BUSYB status bit can also be updated and available through a standard status register read and/or polling command irrespective of enabling of the active polling mode as described herein. In other implementations, a "READYB/BUSY" status bit may alternatively be available. In this fashion, backwards compatibility can be maintained between older generations of serial memory devices, as well as providing support of other industry standards. Thus, once an internal operation has completed, the status register (e.g., in register block 702) can be updated, and in addition the serial output pin (SO) can be appropriately driven to indicate completion of execution of the self-timed internal operation on the serial memory device when the active polling mode has been enabled. In this way, the host (e.g., 402) need not perform periodic polling of the serial memory device (e.g., 404) if active polling has been enabled; however, the host still may have the option of performing such periodic polling.

Figure 10:
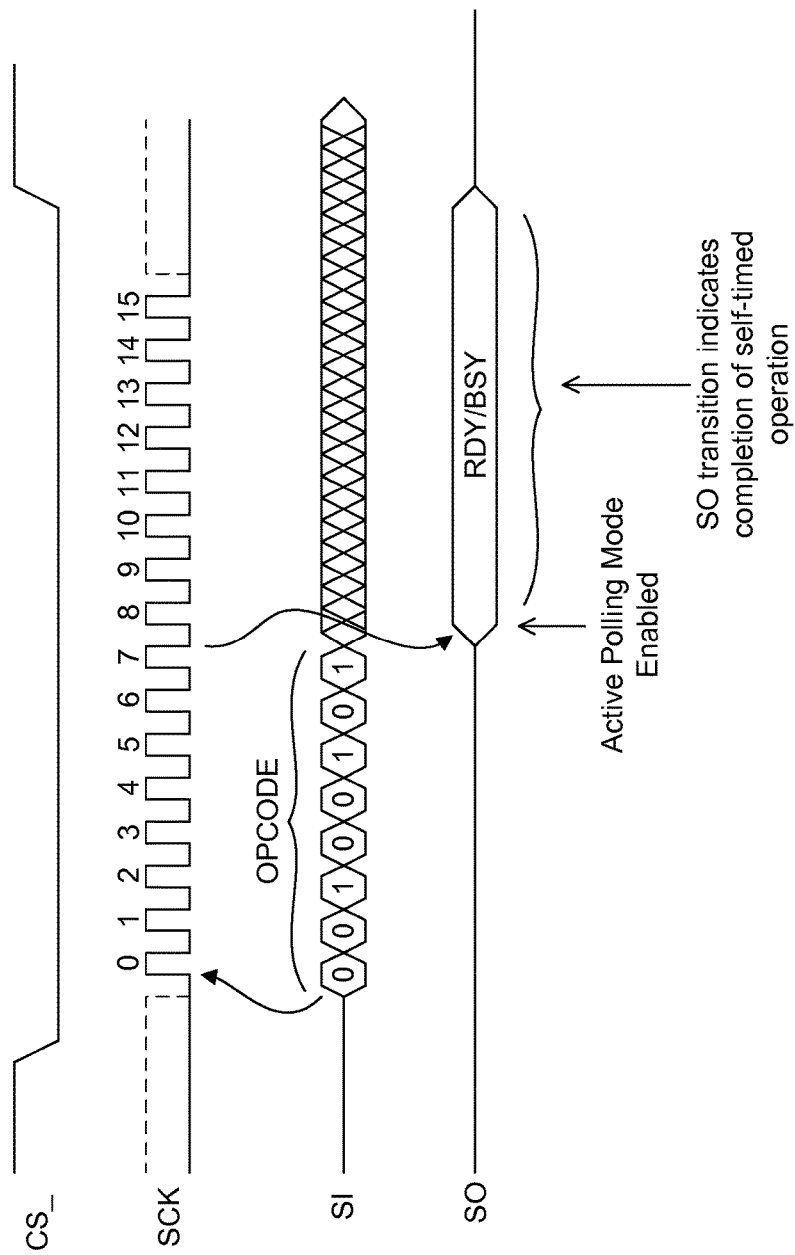
FIG. 10 is a waveform diagram of a first example alerting as to completion of a self-timed internal operation, in accordance with embodiments of the present invention.

Referring now to FIG. 10, shown is a waveform diagram of a first example alerting as to completion of a self-timed internal operation, in accordance with embodiments of the present invention. In this particular example of an active polling mode or operation, the chip select signal can be activated to select the serial memory device. The serial clock SCK can be toggled to capture the opcode provided on the serial input signal. For example, each rising edge of SCK can capture a bit in a bit string from a most significant bit to a least significant bit of the opcode. Thus, opcode 00100101=25h can be received and matched against a predetermined opcode in order to enable active polling operation or mode. In this particular example, once the active polling operation has been enabled, the serial output can change from a high impedance state to a low impedance state. For example, the serial output can be driven low or high on the falling edge of SCK following input of the opcode matching the predetermined opcode (e.g., 25h). The serial output signal may then be driven to the opposite low impedance state (transitioning from 0 to 1, or from 1 to 0) once execution of the self-timed internal operation has been determined to be complete.

Figure 11:
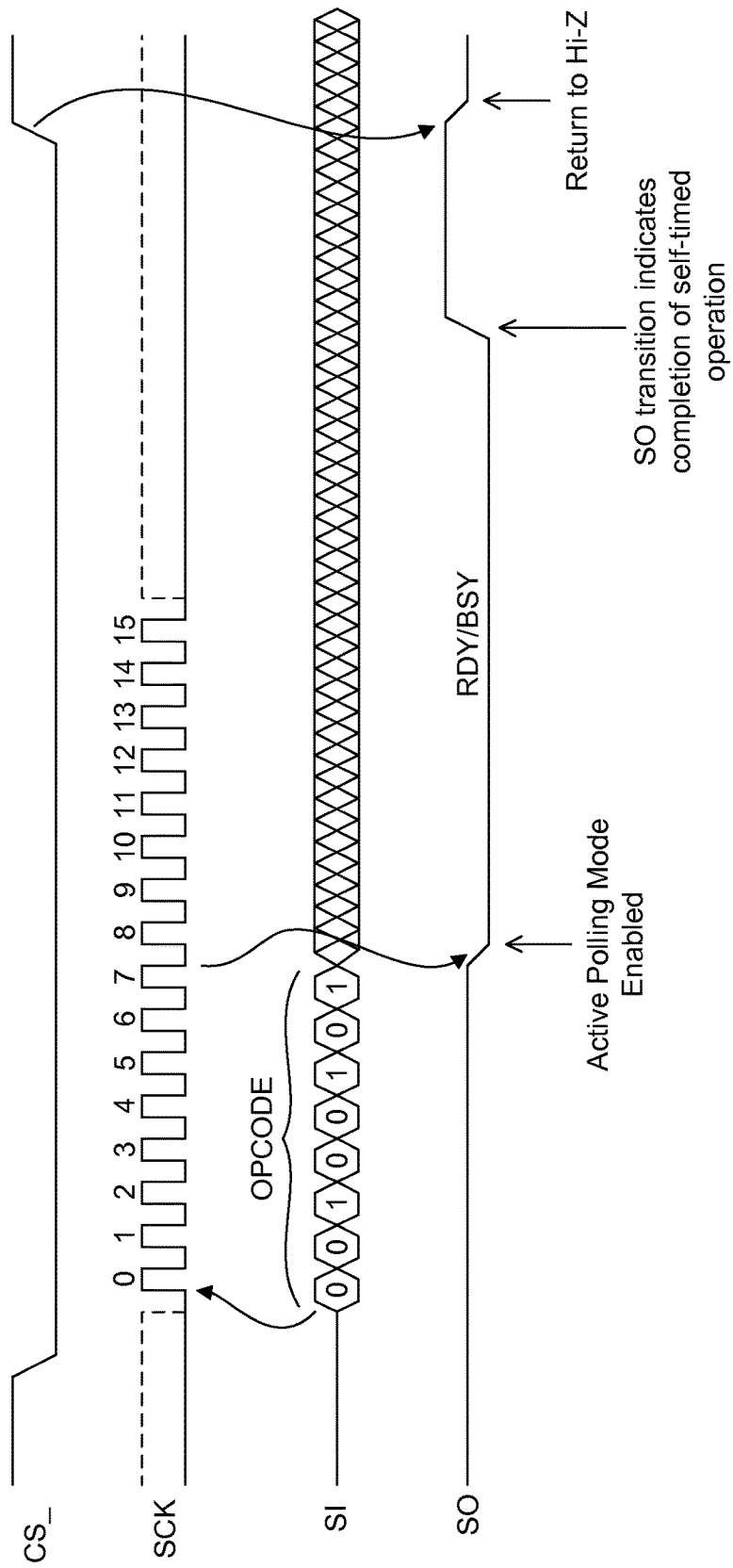
FIG. 11 is a waveform diagram of a second example alerting as to completion of a self-timed internal operation, in accordance with embodiments of the present invention.

Referring now to FIG. 11, shown is a waveform diagram of a second example alerting as to completion of a self-timed internal operation, in accordance with embodiments of the present invention. In this particular example, the active polling mode can be entered in the same fashion, by activation of the chip select signal to select the serial memory device, and toggling the serial clock SCK to capture the opcode provided on the serial input signal. For example, each rising edge of SCK can capture a bit in a bit string from a most significant bit to a least significant bit of the opcode. Thus, opcode 00100101=25h can be received and matched against a predetermined opcode in order to enable active polling operation or mode. In this particular example, once the active polling operation has been enabled, the serial output can change from a high impedance state to a low impedance state with a low logic level on the SO pin on the falling edge of SCK following input of the opcode matching the predetermined opcode (e.g., 25h). The serial output signal may then be driven high (transitioning from 0 to 1) once execution of the self-timed internal operation has been determined to be complete. After the chip select is de-asserted, the SO pin can return to the high impedance state.

Figure 12:
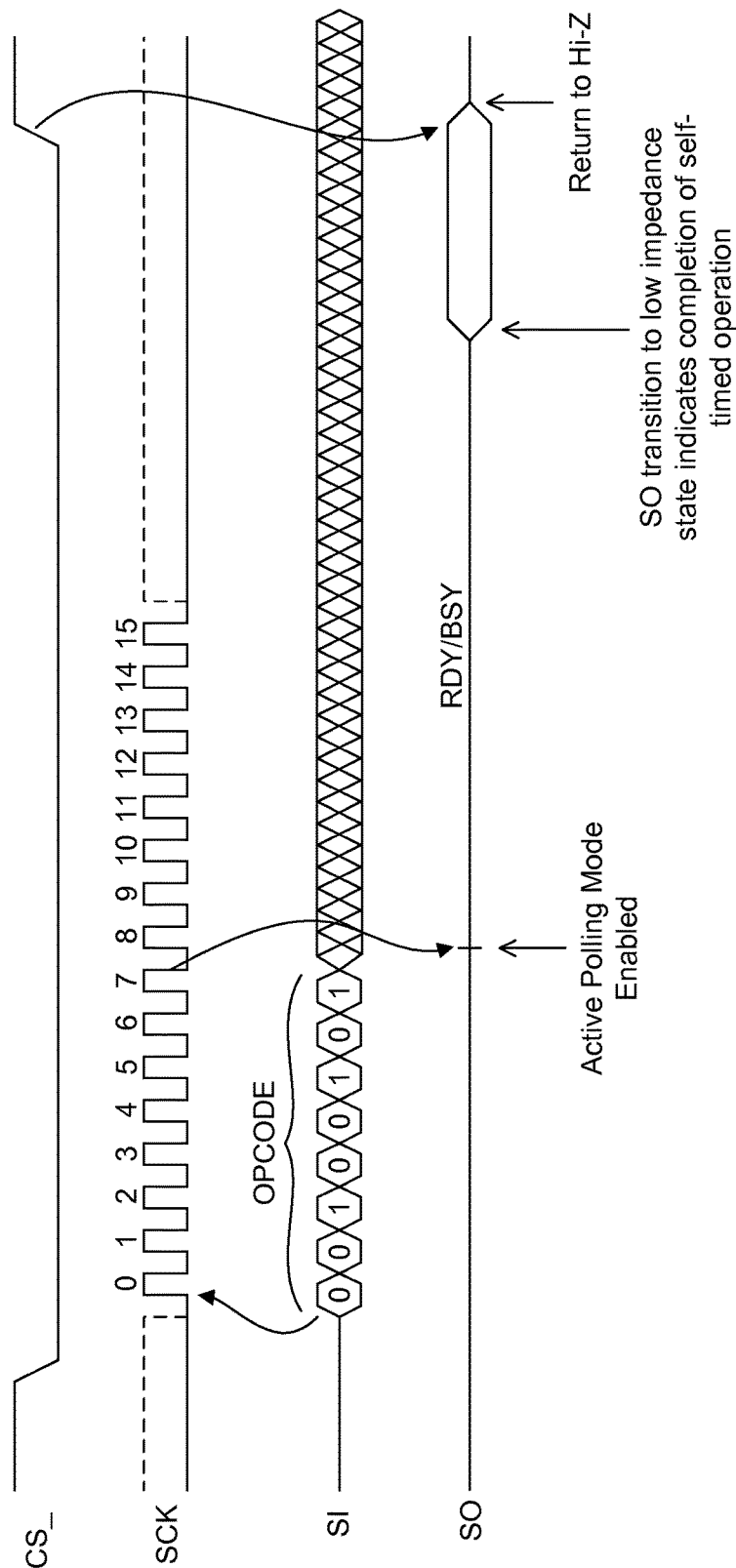
FIG. 12 is a waveform diagram of a third example alerting as to completion of a self-timed internal operation, in accordance with embodiments of the present invention.

Of course, particular embodiments may also be suitable for other opcodes, as well as other types of interfaces (e.g., parallel interfaces, DQ signaling, etc.). Also, the states on the serial or other output signal that indicates that the self-timed internal operation is complete can be any suitable states. In one example as shown in FIG. 12, the serial output signal may remain in a high impedance state after the active polling mode is enabled, and can be driven to a low impedance state (0 or 1) once the self-timed internal operation is complete. As another example, the serial clock may not continue to clock after input of the opcode. In this case, the output driven on the serial output signal can be asynchronous in that the signal can be provided without reference to a particular serial clock edge.

Figure 13:
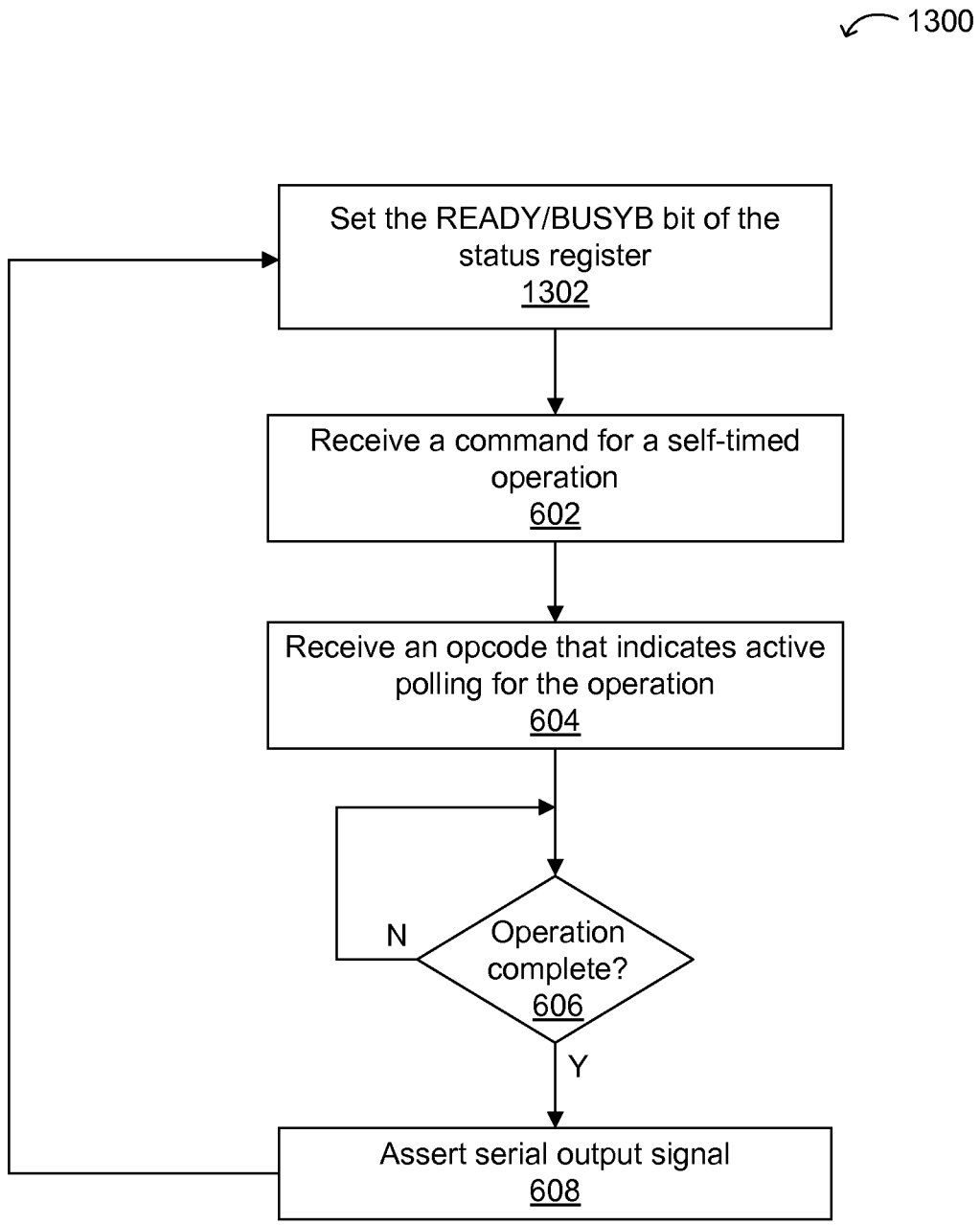
FIG. 13 is a flow diagram of an example method of alerting as to completion of a self-timed internal operation with register updating, in accordance with embodiments of the present invention.

Referring now to FIG. 13, shown is a flow diagram 1300 of an example method of alerting as to completion of a self-timed internal operation with register updating, in accordance with embodiments of the present invention. At 1302, the ready/busyb status bit of the status register (e.g., in register block 702) can be set (e.g., to a high level). In other implementations, the ready/busyb status bit of the status register (e.g., in register block 702) can be reset (e.g., to a low level). At 602, a command for a self-timed operation can be received (e.g., via command decoder 120). For example, the command can be provided via the serial input signal, and may be a program or an erase operation to be performed on one or more storage cells in flash memory array 502. At 604, an opcode that indicates or enables active polling for the self-timed operation can be received (e.g., at a mode detector). For example, the opcode can be provided as a bit string (e.g., one bit at a time) via the serial input signal and may be clocked in via SCK.

In particular embodiments, once the active polling operation has been enabled (e.g., via receiving a particular opcode), the serial memory device can provide an indication when the self-timed operation has completed execution, and without other commands or periodic polling or the like from host 402. Once the operation is complete at 606, the serial output signal can be asserted at 608. In other implementations, the serial output signal can be de-asserted at 608. For example, once a program or erase operation has completed execution, the serial output signal can change from a logic level low to a logic level high (e.g., 0 to 1), or from a logic level high to a logic level low (e.g., 1 to 0), in order to indicate that the operation is complete. In addition, one or more registers (e.g., a status register in register block 702) can also have a ready/busyb status bit written (e.g., at 1302) along with activation of the serial output signal, in order to indicate completion of the self-timed operation.

Figure 14:
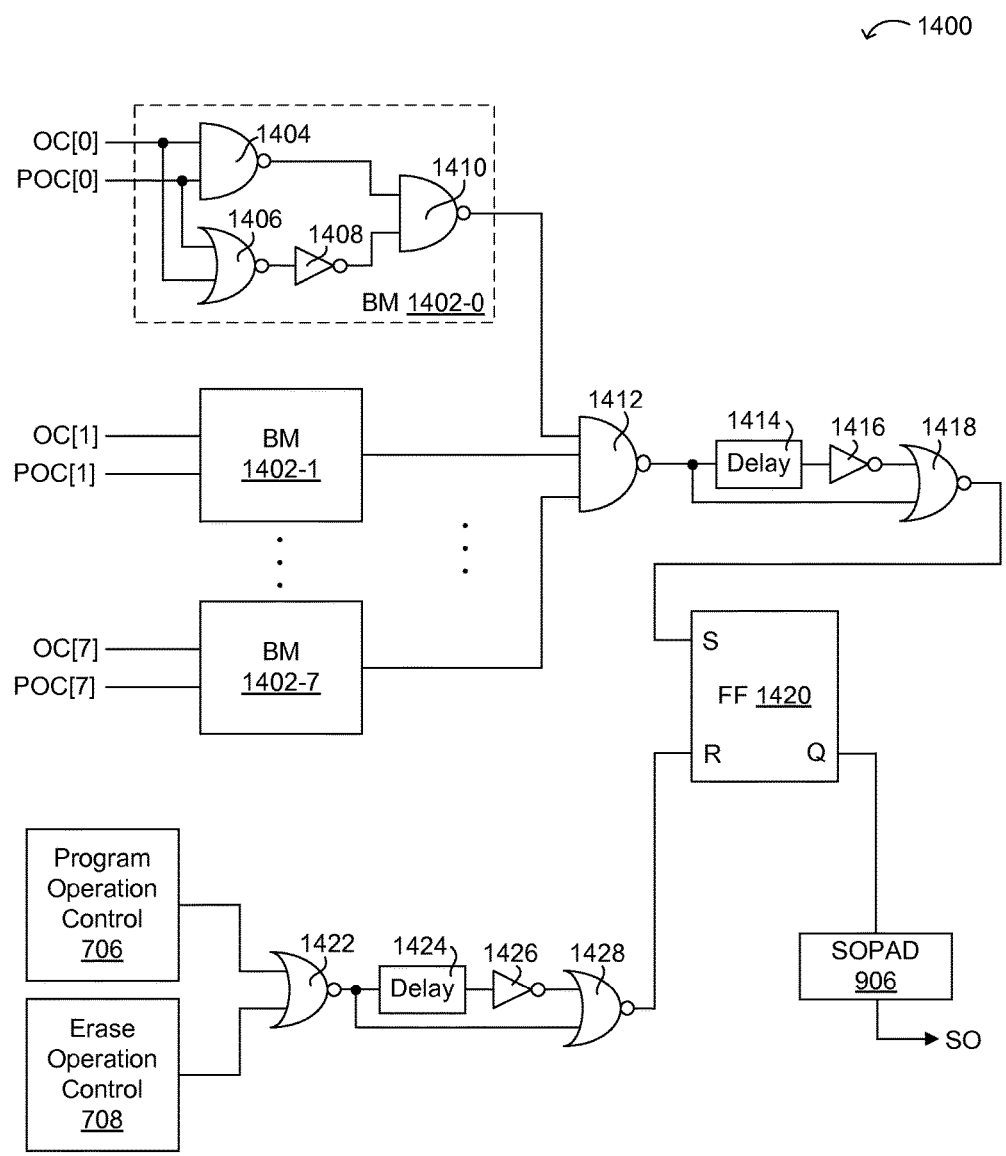
FIG. 14 is a schematic block diagram of example control for an active polling mode, in accordance with embodiments of the present invention.

Referring now to FIG. 14, shown is a schematic block diagram 1400 of example control for an active polling mode, in accordance with embodiments of the present invention. This particular circuit represents one example of a circuit that may be part of, e.g., digital logic 902, for comparing bit strings of the opcode, and using a signal that indicates completion of execution of a self-timed operation to drive a signal on the serial output (SO) pad. As discussed above, in order to determine whether an active polling mode has been enabled, the received opcode can be compared against a predetermined opcode (e.g., 25h). These bit strings can be compared on a bit-by-bit basis by bit match (BM) circuits 1402. For example, BM 1402-0 can include NAND gate 1404, NOR gate 1406, inverter 1408, and NAND gate 1410, and may provide a logic high level if bit position OC[0] from the received opcode matches a corresponding bit position POC[0] from the predetermined opcode.

Similarly, each of the remaining bit positions of the received and predetermined opcodes can be compared by BM circuits 1402-1 through 1402-7. If each bit position of the received and predetermined opcodes matches to indicated that an active polling mode is enabled, a low level can be output by NAND gate 1412. Upon this low-going edge transition output by NAND gate 1412, a one-shot circuit including delay circuit 1414, inverter 1416, and NOR gate 1418, can be used to generate a high-going pulse to the set input of flip-flop 1420. Thus, SOPAD circuit 906 can receive a high level, and may use this to drive the SO pin low (see, e.g., active polling mode enabled in FIG. 11).

Program operation control 706 and erase operation control 708 can provide a signal to indicate when a corresponding self-timed operation had completed execution. For example, a program operation can be considered complete when a program verify operation or read of the memory cell that is being written indicates that the state of the cell has changed to the desired value (e.g., a low resistance or logic 0 value). In one example, program operation control 706 can output a high level control signal to indicate that the program operation is complete. Similarly, if the write operation is an erase operation, the erase operation can be considered complete when an erase verify operation or read of the memory cell that is being written indicates that the state of the cell has been changed to the desired value (e.g., a high resistance or logic 1 value), and the erase operation control 706 can output a high level control signal to indicate that the erase operation has completed execution.

Once the write operation has completed execution, the output of NOR gate 1422 can go low. Upon this low-going edge transition output by NOR gate 1422, a one-shot circuit including delay circuit 1424, inverter 1426, and NOR gate 1428, can be used to generate a high-going pulse to the reset input of flip-flop 1420. Thus, SOPAD circuit 906 can receive a low level signal from flip-flop 1420, and may use this to drive the SO pin high (see, e.g., SO transition indicates completion of self-timed operation in FIG. 11). The example circuitry and control in FIG. 14 represents only one implementation of active polling mode control; however, particular embodiments are suitable to a wide variety of possible circuit implementations and/or control of the active polling mode. In any event, particular embodiments support an active polling mode configured to provide an output pin indication that a self-timed operation on a memory device has completed execution.

While the above examples include circuit, operational, and structural implementations of certain memory cells and programmable impedance devices, one skilled in the art will recognize that other technologies and/or cell structures can be used in accordance with embodiments. Further, one skilled in the art will recognize that other device circuit arrangements, architectures, elements, and the like, may also be used in accordance with embodiments. Further, the resistance levels, operating conditions, and the like, may be dependent on the retention, endurance, switching speed, and variation requirements of a programmable impedance element.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A serial memory device, comprising:
   a) a command decoder configured to detect a self-timed operation that is to be executed on the serial memory device;
   b) a mode detector comprising a plurality of bit match circuits, and being configured to detect when an active polling mode is enabled by matching a received opcode against a predetermined opcode via the plurality of bit match circuits, wherein the received opcode is serially clocked into the serial memory device one bit at a time; and
   c) an operation completion indicator configured to provide a completion indication external to the serial memory device when the self-timed operation has completed execution and the active polling mode is enabled.

2. The serial memory device of claim 1, wherein the self-timed operation comprises a write operation.

3. The serial memory device of claim 1, further comprising a plurality of serial inputs.

4. The serial memory device of claim 3, wherein the received opcode is serially clocked into the serial memory device at each of the plurality of serial inputs.

5. The serial memory device of claim 1, wherein the predetermined opcode comprises 25h.

6. The serial memory device of claim 1, wherein the completion indication is provided as a signal on a serial output pin of the serial memory device.

7. The serial memory device of claim 6, wherein the completion indication comprises changing a state of the signal on the serial output pin.

8. The serial memory device of claim 1, further comprising a status register configured to be written to along with the completion indication to indicate that the self-timed operation has completed execution.

9. The serial memory device of claim 1, further comprising a plurality of resistive memory cells, wherein each of the resistive memory cells is configured to be programmed to a low resistance state by application of a first voltage in a forward bias direction, and to be erased to a high resistance state by application of a second voltage in a reverse bias direction.

10. A memory system, comprising;
    a) a host; and
    b) the serial memory device of claim 1.

11. The memory system of claim 10, further comprising a serial peripheral interface (SPI) between the host and the serial memory device.

12. A method of performing an active polling operation, the method comprising:
    a) detecting a self-timed operation that is to be executed on a serial memory device;
    b) determining if an active polling mode has been enabled by matching a received opcode against a predetermined opcode, wherein the received opcode is serially clocked into the serial memory device one bit at a time;
    c) determining when the self-timed operation has completed execution on the serial memory device; and d) providing a completion indication external to the serial memory device when the self-timed operation has completed execution and the active polling mode is enabled.

13. The method of claim 12, wherein the self-timed operation comprises a write operation.

14. The method of claim 12, wherein the serial memory device comprises a plurality of serial inputs.

15. The method of claim 14, wherein the receiving the opcode comprises serially clocking into the serial memory device at each of the plurality of serial inputs.

16. The method of claim 12, wherein the predetermined opcode comprises 25h.

17. The method of claim 12, wherein the providing the completion indication comprises driving a signal on a serial output pin.

18. The method of claim 17, wherein the driving the serial output pin changing a state of the serial output pin of the serial memory device.

19. The method of claim 12, further comprising writing a status register on the serial memory device along with the completion indication to indicate that the self-timed operation has completed execution.

20. The method of claim 12, wherein the serial memory device comprises a plurality of resistive memory cells, wherein each of the resistive memory cells is configured to be programmed to a low resistance state by application of a first voltage in a forward bias direction, and to be erased to a high resistance state by application of a second voltage in a reverse bias direction.

* * * * *